United States Patent [19]
Hirt et al.

[11] 4,081,699
[45] Mar. 28, 1978

[54] DEPLETION MODE COUPLING DEVICE FOR A MEMORY LINE DRIVING CIRCUIT

[75] Inventors: Ernie R. Hirt, Harleysville; William Mensch, Jr., Norristown; Richard M. Greene, Audubon, all of Pa.

[73] Assignee: MOS Technology, Inc., Norristown, Pa.

[21] Appl. No.: 723,207

[22] Filed: Sep. 14, 1976

[51] Int. Cl.² .................. H03K 17/60; H03K 17/04; H03K 17/12; H03K 3/353
[52] U.S. Cl. ............................. 307/270; 307/246; 307/251; 307/DIG. 5
[58] Field of Search ............ 307/205, 208, 246, 238, 307/251, 270, DIG. 4, DIG. 5

[56] References Cited
U.S. PATENT DOCUMENTS

| | | | |
|---|---|---|---|
| 3,702,945 | 11/1972 | Faith et al. | 307/251 |
| 3,736,522 | 5/1973 | Padgett | 307/251 X |
| 3,835,457 | 9/1974 | Yu | 307/270 X |
| 3,909,627 | 9/1975 | Mizuno | 307/DIG. 4 X |
| 3,959,781 | 5/1976 | Mehta et al. | 307/DIG. 5 X |
| 3,988,617 | 10/1976 | Price | 307/205 X |

OTHER PUBLICATIONS

Knepper; "Enhancement/Depletion Mode Field-Effect Transistor Driver"; *IBM Tech. Discl. Bull.*, vol. 19, No. 3, pp. 922-923; 8/1976.
Chu et al., "Bootstrap Push-Pull Driver"; *IBM Tech. Discl. Bull.*; vol. 18, No. 3, pp. 710-711; 8/1975.

*Primary Examiner*—Larry N. Anagnos
*Attorney, Agent, or Firm*—Cooper, Dunham, Clark, Griffin & Moran

[57] ABSTRACT

A circuit for energizing a memory drive line depending on the state of a control signal and the states of two complementary clocks uses a depletion mode MOS coupling device rather than the conventional enhancement mode device used in such cases, and energizes the memory line with a higher voltage than possible in the prior art and at better rise and fall times.

3 Claims, 4 Drawing Figures

DEPLETION MODE COUPLING DEVICE FOR A MEMORY LINE DRIVING CIRCUIT

BACKGROUND AND SUMMARY OF THE INVENTION

In microprocessors, such as the series of microprocessors sold by MOS Technology, Inc., of Pennsylvania under the designation 650X, as well as in other microprocessors and related memory devices, it is common to use so-called memory line driving circuits to raise the voltage level of a memory drive line, such as a row select line, depending on a certain combination of a control signal and two clocks. For example, the inputs to the driving circuit may be an operating voltage for the circuit, a control signal and a first clock and a second clock complementary to each other, and the circuit may be set up such that its output drive line is high when the control signal and the first clock are low but the second clock is high, while the same output drive line is low at all other times. It is common in such driving circuits to use an MOS transistor device operating in an enhancement mode as a couple between, on the one hand, the operating voltage source and the control signal source and, on the other hand, the second clock and the output line. The couple is used to minimize the capacitive coupling between the second clock and the side of the couple connected to the operating volage source and the control signal source, and to connect and disconnect one part of the driving circuit to or from another at appropriate times.

In accordance with this invention it has been discovered that while a couple of this type serves the function of coupling and decoupling the respective two sides of the circuit at the proper times, it also prevents the full voltage from the operating voltage supply and the clocks from appearing on the output driving line, and that a depletion rather than an enhancement couple may be used in a way which appears inappropriate for a depletion couple but in fact provides significantly improved results.

More specifically, it is believed that a certain combination of inherent device capacitances prevents a full voltage transfer to the output driving line in the conventional enhancement couple circuit, and that a depletion couple circuit, though seemingly inappropriate, in fact permits the full transfer of voltage to the output driving line, and additionally gives significant speed advantages over an enhancement couple. It is believed that the discovered workability of the depletion couple is at least in part due to a device body effect which has not been previously appreciated for depletion mode uses of this type.

DETAILED DESCRIPTION

Figure 1:
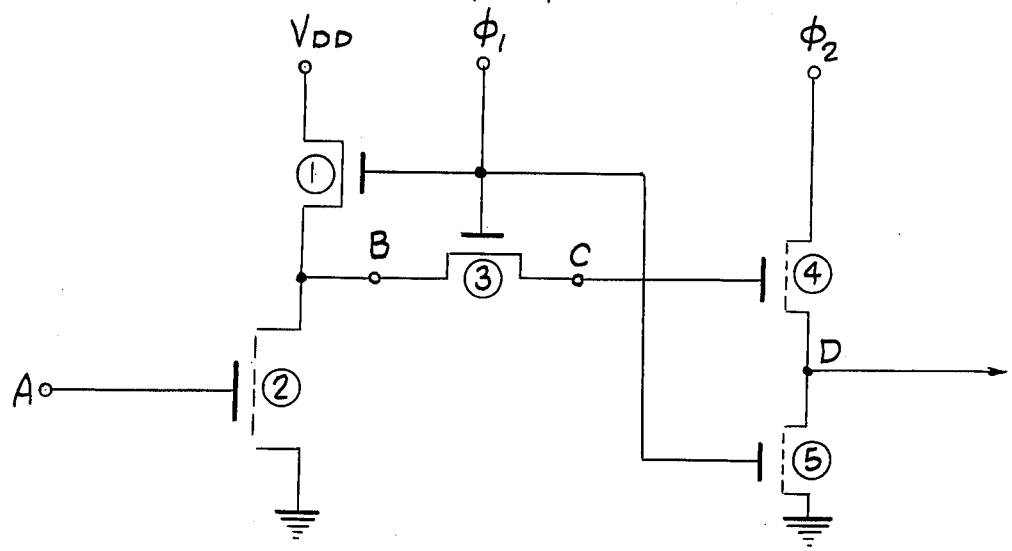
FIG. 1 is a circuit diagram of a memory line driving circuit examplifying the invention.

Referring to FIG. 1, the illustrated circuit provides an output driving signal at node D depending on the combination of a control signal at node A and a first clock $\phi_1$ and a second clock $\phi_2$ which are complementary to each other. An operating voltage $V_{DD}$ is supplied from a suitable source, as are the control signal and the two clocks. The circuit comprises devices 1 through 5, which are MOS transistor devices implemented as an MOS integrated circuit on the same chip. Devices 1 and 3 are depletion mode devices, i.e., they conduct between their main terminal at 0 volts at their gates and increase conduction as the voltage at their gate is increased in the positive direction. Devices 2, 4 and 5 are enhancement mode devices, i.e., they do not conduct between their main terminals at 0 volts at their gates but start conducting as the voltage of their gates is raised in the positive direction.

In operation, the output driving line at node D goes high only when the control signal at node A and the first clock are low but the second clock is high. One desirable feature in circuits of this type is to minimize delay between the second clock and the output driving signal at node D. Another desirable feature is to have minimal voltage drop between the input signals to the circuit and the output driving signal at node D; this becomes particularly critical in the low voltage microprocessors and associated devices which have been recently introduced, e.g., those requiring only about +5 volts supplies and clocks.

In the prior art known to the inventors, memory line driving circuits of this type use an enhancement device as a coupling between nodes B and C, as enhancement devices are commonly used as couples, but do not use depletion devices between nodes B and C because depletion devices are commonly used as load devices and their use as a couple is seemingly inappropriate. However, by using a depletion device as a couple between nodes B and C in accordance with the invention, not only is it possible to couple and decouple these two nodes as appropriate in the operation of the memory line driving circuit, but it is also possible to transfer to the output driving line at node D all or nearly all of the voltage level input into the circuit, and to do so at better rise and fall times of node D than in the known prior art.

One reason for having a couple of any type between nodes B and C is to disconnect when appropriate the large inherent capacitance of node B from the smaller capacitance of node C. This separation allows for a desirable capacitive coupling of the second clock to node C to occur so as to keep the output driving line at node D from going high during the high of $\phi_1$ because of a voltage divider action between devices 4 and 5. Such capacitive coupling additionally keeps the same output driving line at node D from falling too slowly because of a similar voltage divider action. The prior art use of an enhancement couple between nodes B and C allows this desirable capacitive coupling of the second clock to node C but, because of inherent device characteristics, the voltage at node C during the high of the first clock can only get to one device threshold down from the voltage at node B. When the second clock subsequently goes high, the voltage at node C rises due to the coupling to approximately the supply voltage, assuming that the highs of the two clocks are at about the level of the supply voltage. However, the volage at the output driving line at node D can then only rise to about the supply voltage minus a device threshold. As a result, it is possible, particularly at the relatively low supply voltage levels of contemporary microprocessor systems (e.g., about +5 volts) for the voltage of th output driving line at node D to rise to substantially less than the supply voltage, e.g., to rise to only about 2-3 volts, which may not be sufficient to unambiguously select a memory line, e.g., a memory row line.

In accordance with the invention, nodes B and C are coupled by a depletion mode device, although depletion devices are typically used as load devices and are seemingly inappropriate for use as couples in circuits of this type. When device 3 is a depletion device, as shown in FIG. 1, node B can also rise to the supply voltage, but since device 3 is a depletion device the voltage at node C during the high of the first clock can now get to the full supply voltage due to the intrinsically on characteristic of depletion devices. Then when the second clock goes high, the voltage on node C rises, due to the intrinsic capacitive coupling, to a value which is at about, or greater than, the sum of the supply voltage and threshold voltage of device three, e.g., the voltage at node C rises to about 7-8 volts. This higher voltage at node C then allows a voltage about equal to the supply voltage (+5 volts) to be transferred to the output driving line at node D.

There are at least two advantages gained from using a depletion couple between nodes B and C. One is that the voltage at node C at the time the second clock goes high and node C is charged, is higher than when an enhancement couple is used, with the result than when the high of the second clock comes node D can charge up faster, resulting in less delay between the second clock and the memory line driving signal at node D. The other is that node D can now reach a higher voltage, about equal to the full supply voltage: thus, it supplies greater drive to any memory line or other device attached to it.

Depletion devices are used as load devices, and a depletion device is used in the circuit of FIG. 1 in a manner apparently suitable only to an enhancement device. Since a depletion device conducts current with 0 volts between its gate and source, charger from the higher voltage side of the device flows to the lower voltage side, equalizing the voltages on the two sides. This, of course, reduces the voltage on the higher side. In the circuit of FIG. 1, however, when node C goes above the supply voltage as discussed above, node B is at the supply voltage. With node B acting as the source for the device, a device body effect action is believed to occur in device 3 such that no charge flows between its main terminals. As there is no charge flow, the voltage on node C is not reduced but stays higher than the supply voltage, thus furnishing the desired drive.

Figure 2:
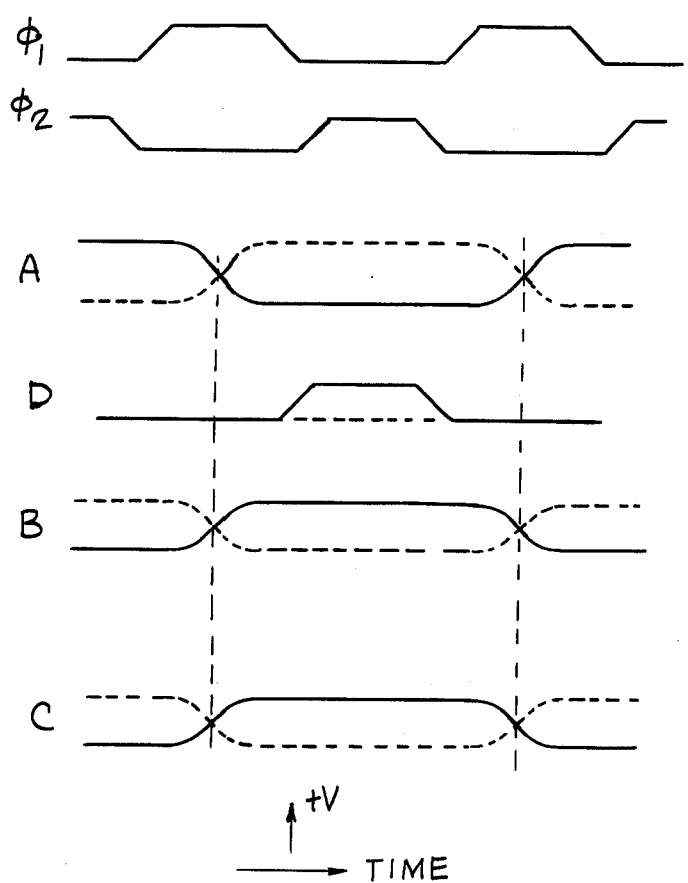
FIG. 2 is a timing diagram showing voltage level transitions at various nodes of te circuit in FIG. 1 at various times.

The following table gives the conducting or nonconducting states of devices 1 through 5 and the approximate voltages at nodes A through D at the indicated combinations of the high and low levels of the control signal at node A and the first and second clocks, while FIG. 2 supplements as an illustration of the relative timing of the clocks and the signals at the respective nodes.

| | DEVICES | | | | | NODES | | | |
|---|---|---|---|---|---|---|---|---|---|
| | 1 | 2 | 3 | 4 | 5 | A | B | C | D |
| A low $\phi_1$ high A low | on | off | on | on | on | .4 | 0 | 5 | 0 |
| $\phi_2$ high A high | off | off | on | on | off | .4 | 5 | from 5 to 7-8 | 0→5 |
| $\phi_1$ high A high | on | on | on | off | on | 5 | 0 | 0 | 0 |

| | DEVICES | | | | | NODES | | | |
|---|---|---|---|---|---|---|---|---|---|
| | 1 | 2 | 3 | 4 | 5 | A | B | C | D |
| $\phi_1$ low | on | on | on | off | off | 5 | 0 | 0 | 0 |

Figure 3:
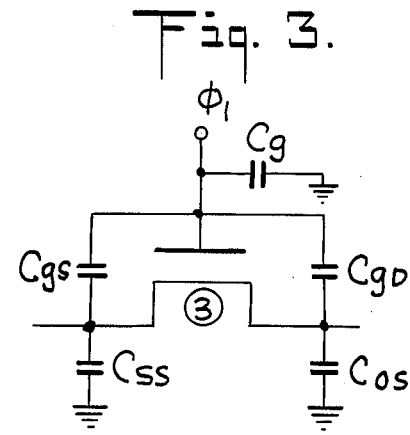
FIGS. 3 and 4 are circuit diagrams showing certain inherent capacitive effects of devices which are a part of the circuit in FIG. 1.
Figure 4:
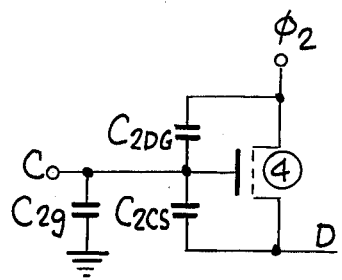

FIGS. 3 and 4 illustrate the intrinsic capacitances believed associated with the circuit portion adjacent devices 3 and 4 respectively. The desired capacitive coupling effect of the second clock on node C becomes possible only if $C_{2DG}$ is much greater than $C_{2g}$. The technique of making this possible by minimizing $C_{2g}$ is to disconnect the intrinsically large capacitance of node B from the smaller capacitance at node C as described above.

We claim:

1. A single chip, MOS IC implemented, memory line driving circuit comprising:

a source of a control signal having a low and a high level, a source of an operating voltage and sources of a first and a second clock each alternating between a low and a high level, the high level of the clocks being comparable to that of the operating voltage and the two clocks complementing each other;

first through fifth MOS transistor devices each having a gate and two main terminals, the first and second devices having their main terminals connected in series between the operating voltage source and ground, the third device having its main terminals connected between the junction of the first and second devices and the gate of the fourth device, the fourth and fifth devices having their main terminals connected in series between the source of the second clock and ground, the first, third and fifth devices having their gates connected to the source of the first clock, and the second device having its gate connected to the control signal source; and the first and third devices being depletion mode devices and the second, fourth and fifth devices being enhancement mode devices, the junction between the fourth and fifth devices providing a memory line driving signal, said memory line driving signal being at a high voltage level approximating the voltage level of the operating voltage supply and the high-level of the clocks when each of the control signal and the first clock are at their low levels while the second clock is at its high level, and said memory line driving signal being at a low level at all other times.

2. A driving circuit as in claim 1 wherein the only capacitive connection between the third and fourth devices is made up of the inherent capacitances of said third and fourth devices.

3. An MOS IC implemented memory line driving circuit comprising:

a source of a positive supply voltage, two clock sources each alternating between a high voltage level approximately the supply voltage and a low voltage level, the two clocks being complementary, and a source of a control signal having a high or a low voltage level, and an output line;

a delpetion MOS transistor device couple having a gate, a source and a drain, and having an inherent device threshold voltage characteristic;

means for charging, during a first time interval, the drain side of said couple to a voltage level approximating the supply voltage when each one of the control signal and the two clocks is at a respective selected level;

means for charging, during a second, subsequent time interval, the source side of the couple to a voltage approximating the supply voltage and the drain side to a voltage approximating the sum of the supply voltage and said device threshold voltage when the control signal is at the same level as in the first time interval but each of the clocks is at an opposite level; and means for gating one of said clocks to the output line by said voltage at the drain side of the couple during the second time interval to thereby apply to said output line a voltage approximating the supply voltage.

* * * * *